(12) United States Patent
Ahn

(10) Patent No.: US 8,671,369 B2
(45) Date of Patent: Mar. 11, 2014

(54) QUANTUM KARNAUGH MAP

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 604 days.

(21) Appl. No.: 12/633,575

(22) Filed: Dec. 8, 2009

(65) Prior Publication Data

US 2011/0138344 A1    Jun. 9, 2011

(51) Int. Cl.
*G06F 17/50* (2006.01)
*H01L 25/00* (2006.01)
*H03K 19/02* (2006.01)

(52) U.S. Cl.
USPC ........... 716/100; 716/106; 716/110; 716/111; 716/132; 716/136; 716/139; 326/41; 326/59

(58) Field of Classification Search
USPC ................. 716/100, 110, 111, 132, 136, 139; 326/41, 59
See application file for complete search history.

(56) References Cited

U.S. PATENT DOCUMENTS

| | | | | |
|---|---|---|---|---|
| 6,133,754 | A * | 10/2000 | Olson | 326/59 |
| 6,215,327 | B1 * | 4/2001 | Lyke | 326/41 |
| 6,829,750 | B2 * | 12/2004 | Maki et al. | 326/113 |
| 7,334,200 | B2 * | 2/2008 | Parhi et al. | 716/105 |
| 7,823,112 | B1 * | 10/2010 | Makarov et al. | 716/129 |
| 7,873,130 | B2 * | 1/2011 | Ludwig | 375/375 |
| 7,920,704 | B2 * | 4/2011 | Brandt | 380/263 |
| 7,969,805 | B2 * | 6/2011 | Thom et al. | 365/209 |
| 8,015,510 | B2 * | 9/2011 | Brunet et al. | 716/129 |
| 2005/0110106 | A1 * | 5/2005 | Goto et al. | 257/432 |
| 2005/0133780 | A1 * | 6/2005 | Azuma | 257/13 |
| 2006/0123363 | A1 | 6/2006 | Williams et al. | |
| 2008/0140749 | A1 * | 6/2008 | Amato et al. | 708/490 |

FOREIGN PATENT DOCUMENTS

| | | |
|---|---|---|
| CN | 2232035 Y | 7/1996 |
| CN | 2280090 Y | 4/1998 |
| JP | 2002-042104 | 2/2002 |
| JP | 2006-195587 | 7/2006 |
| JP | 2008-028320 | 2/2008 |

OTHER PUBLICATIONS

Chuan-Ching Sue; "An Enhanced Universal N x N Fully Nonblocking Quantum Switch"; Publication Year: 2009; Computers, IEEE Transactions on; vol. 58 , Issue: 2; pp. 238-250.*

Wang et al.; "Modified Karnaugh map for quantum Boolean circuits construction"; Publication Year: 2003; Nanotechnology, 2003. IEEE-NANO 2003. 2003 Third IEEE Conference on; vol. 2; pp. 651-654 vol. 2.*

Mottonen et al.; "Quantum Circuits for General Multiqubit Gates"; 2004; arxiv.org/pdf/quant-ph/0404089Cached; FIN-02015 HUT, Helsinki University of Technology, Finland.*

Adriano Barenco, et al "Elementary gates for quantum computation" Physical Review A, vol. 52, No. 5, Nov. 1995, pp. 3457-3467.

(Continued)

*Primary Examiner* — Helen Rossoshek
(74) *Attorney, Agent, or Firm* — Dorsey & Whitney LLP

(57) ABSTRACT

Techniques for determining and a computing device configured to determine a quantum Karnaugh map through decomposing a quantum circuit into a multiple number of sub-circuits are provided. Also, techniques for obtaining and a computing device configured to obtain a quantum circuit which includes the minimum number of gates among possible quantum circuits corresponding to a quantum Karnaugh map are also provided.

23 Claims, 6 Drawing Sheets

(56) References Cited

OTHER PUBLICATIONS

D. Ahn, et al "Time-convolutionless reduced-density-operator theory of a noisy quantum channel: Two-bit quantum gate for quantum-information processing" Physical Revie A., vol. 61, 2000, pp. 052310-1 to 052310-9.

Won Young Hwang, et al "Quantum gambling using two nonorthogonal states" Physical Review A., vol. 64, 2001, pp. 064302-1 to 064302-4.

Won Young Hwang, et al "Eavesdropper's optimal information in variations of Bennett-Brassard 1984 quantum key distribution in the coherent attacks" Physics Letters A, 279 (2001) pp. 133-138.

M. S. Kim, et al "Entanglement induced by a single-mode heat environment" Physical Review A, vol. 65 (2002), 040101(R), pp. 040101-1 to 040101-4.

Doyeol Ahn, et al "Self-consistent non-Markovian theory of a quantum-state evolution for quantum-information processing" Physical Review A, 66, 2002, pp. 012302-1 to 012302-4.

Doyeol Ahn, et al "Intervalley interactions in Si quantum dots" Journal of Applied Physics, 98, 2005, pp. 033709-1 to 033709-7.

W. Son, et al "Entanglement transfer from continuous variables to qubits" Journal of Modern Optics, 2002, vol. 49, No. 10, pp. 1739-1746.

Jae-Seung Lee, et al "A Practical Method of Constructing Quantum Combinational Logic Circuits" arXiv:quant-ph/9911053v1, Nov. 12, 1999.

Shiou-An Wang, et al "Modified Karnaugh Map for Quantum Boolean Circuits Construction" Nanotechnology, 2003. IEEE-NANO 2003. 2003 Third IEEE Conference on vol. 2, Aug. 12-14, 2003 pp. 651-654 vol. 2.

Wang S. et al., "Modified Karnaugh Map for Quantum Boolean Circuits Construction", Third IEEE Conference on Nanotechnology (IEEE-NANO 2003), Aug. 12, 2003, vol. 2, pp. 651-654.

Saeedi M. et al., "Algebraic Characterization of CNOT-Based Quantum Circuits with it Applications on Logic Synthesis", 10th Euromicro Conference on Digital System Design Architectures, Methods and Tools (DSD 2007), Lubeck, Germany, Aug. 29, 2007, pp. 339-346.

International Search Report and Written Opinion from International Application No. PCT/KR2010/008656 dated Mar. 31, 2001.

Zhang, J. et al "Modularization of a multi-qubit controlled phase gate and its nuclear magnetic resonance implementation," J. Opt. B: Quantum Semiclass. Opt., vol. 7, No. 1, pp. 18, 2005.

\* cited by examiner

QUANTUM KARNAUGH MAP

BACKGROUND

Quantum information science concerns the information science that depends on quantum effects in physics. It includes theoretical issues in computational models as well as more experimental topics in quantum physics including what can and cannot be done with quantum information. In such quantum information science, significant efforts have been directed towards various physical implementations of quantum bits and quantum circuits.

A quantum circuit is a model for quantum computation in which a computation is a sequence of reversible transformations on a quantum mechanical analog of an n bit register. A Karnaugh map has been used as an efficient method for a logic design. However, the representation of the quantum state evolution in Hilbert space by classical Boolean algebra is not quite straightforward, and thus an efficient design of universal quantum circuits may not be facilitated with a general Karnaugh map.

DETAILED DESCRIPTION

Figure 1:
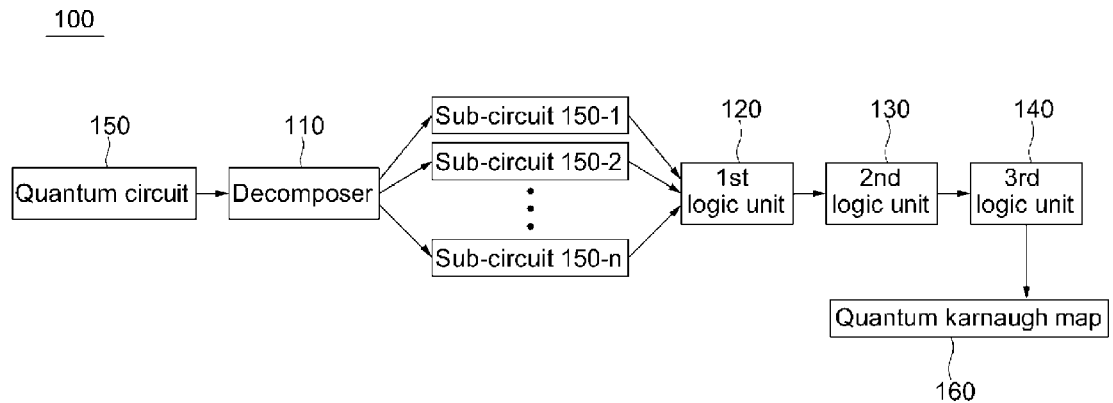
FIG. 1 shows a schematic of selected components of an illustrative embodiment of a computing device configured to determine a quantum Karnaugh map corresponding to a quantum circuit.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

In one embodiment, a computing device configured to determine a quantum Karnaugh map corresponding to a quantum circuit is provided. The computing device includes a decomposer configured to decompose a quantum circuit into a multiple number of sub-circuits, a first logic unit configured to receive possible inputs of each sub-circuit, and determine corresponding outputs of each sub-circuit in response to the received possible inputs to obtain input/output relation of each sub-circuit, a second logic unit configured to construct a sub-quantum Karnaugh map corresponding to each sub-circuit based on the input/output relation of each sub-circuit, and a third logic unit configured to obtain a product of entries in the same position of each sub-quantum Karnaugh map to determine a quantum Karnaugh map corresponding to the quantum circuit.

Each of the multiple number of sub-circuits can include single qubit gates and C-NOT gates.

In another embodiment, a computing device configured to design a quantum circuit is provided. The computing device includes a first module configured to group entries other than identity (I) entries in a quantum Karnaugh map into one or more rectangular groups, and to determine a multiple number of sets of rectangular groups, a second module configured to determine a plurality of quantum circuits corresponding to the quantum Karnaugh map based on the multiple number of sets of rectangular groups, a third module configured to determine the number of single qubit gates and C-NOT gates required for each of the multiple number of quantum circuits, and a selector configured to select a quantum circuit having a minimum number of single qubit gates and C-NOT gates among the multiple number of quantum circuits. Each of the rectangular groups is comprised of neighboring entries, and the number of the neighboring entries of each rectangular group is $2^n$ (n is an integer equal to or greater than zero).

The first module can be further configured to determine the multiple number of sets of rectangular groups for each sequence of control qubits of the quantum Karnaugh map.

The minimum number of single qubit gates and C-NOT gates can be determined based on the following equation:

$$N_m = \begin{cases} 10 + 4N_{m/2} + 2N_{m-1} + \sum_{l=3}^{m}(3 + 2N_{l-2}) & \text{if } R(m/2) = 0 \\ 10 + 2N_{Q(m/2)+1} + 2N_{Q(m/2)} + 2N_{m-1} + \sum_{l=3}^{m}(3 + 2N_{l-2}) & \text{if } R(m/2) = 1, \end{cases}$$

where m is the number of control qubits, Q(m/2) is a quotient of m/2, R(m/2) is a remainder of m/2, and $N_m$ is the minimum number of single qubit gates and C-NOT gates.

The computing device may be implemented as a portion of a small-form factor portable electronic device or a personal computer.

In still another embodiment, a method for designing a quantum circuit implemented on a computing device is provided. The method includes receiving entries other than identity (I) entries in a quantum Karnaugh map to group into one or more rectangular groups, and determining a multiple number of sets of rectangular groups, determining a plurality of quantum circuits corresponding to the quantum Karnaugh map based on the plurality of sets of rectangular groups, determining the number of single qubit gates and C-NOT gates required for each of the plurality of quantum circuits, and selecting a quantum circuit having the minimum number of single qubit gates and C-NOT gates among the plurality of quantum circuits. Each rectangular group is comprised of neighboring entries, and the number of the neighboring entries of each rectangular group is $2^n$ (n is an integer equal to or greater than zero).

The multiple number of sets of rectangular groups can be determined for each sequence of control qubits of the quantum Karnaugh map.

The minimum number of single qubit gates and C-NOT gates can be determined based on the following equations:

$$N_m = \begin{cases} 10 + 4N_{m/2} + 2N_{m-1} + \sum_{l=3}^{m}(3 + 2N_{l-2}) & \text{if } R(m/2) = 0 \\ 10 + 2N_{Q(m/2)+1} + 2N_{Q(m/2)} + 2N_{m-1} + \sum_{l=3}^{m}(3 + 2N_{l-2}) & \text{if } R(m/2) = 1 \end{cases}$$

here m is the number of control qubits, Q(m/2) is a quotient of m/2, R(m/2) is a remainder of m/2, and $N_m$ is the minimum number of gates.

In still another embodiment, a storage medium device having computer readable instructions embodied therewith is provided. The computer readable instructions when executed on a computing device cause the computing device to perform the aforementioned method.

FIG. 1 shows a schematic of selected components of an illustrative embodiment of a computing device 100 configured to determine a quantum Karnaugh map corresponding to a quantum circuit. As depicted, computing device 100 includes a decomposer 110, a first logic unit 120, a second logic unit 130, and a third logic unit 140. In operation, decomposer 110 receives as input a quantum circuit 150. Quantum circuit 150, as used herein, can refer to a representation of a quantum state evolution of a circuit in Hilbert space. For example, quantum circuit 150 may be represented by a vector in a Hilbert space state, which is a linear superposition of all binary states of quantum bits. Quantum circuit 150 is further described below in conjunction with FIG. 2. Decomposer 110 decomposes the received quantum circuit 150 into a multiple number of sub-circuits 150-1 to 150-n. By way of example, quantum circuit 150 can be decomposed such that each of sub-circuits 150-1 to 150-n includes at least one unitary logic operator (U). The possible input values of each of sub-circuits 150-1 to 150-n are input into first logic unit 120. First logic unit 120 determines corresponding output values of each of sub-circuits 150-1 to 150-n in response to the possible input values of each of sub-circuits 150-1 to 150-n to obtain an input/output relation of each of sub-circuits 150-1 to 150-n. As used herein, the term "input/output relation" means a corresponding relation of the possible input values of each of sub-circuits 150-1 to 150-n and the output values of each of sub-circuits 150-1 to 150-n. By way of example, the input/output relation may be represented by a matching table (for example, Tables 1 and 2 below). By way of example, first logic unit 120 can obtain an input/output relation of first sub-circuit 150-1 by determining the output values corresponding to the possible input values of first sub-circuit 150-1 based on the logic structure of first sub-circuit 150-1. By repeating the above operation of first logic unit 120 on the remaining sub-circuits 150-2 to 150-n, the input/output relations of sub-circuits 150-1 to 150-n can be determined.

Second logic unit 130 receives as input the input/output relation of each sub-circuit and constructs a sub-quantum Karnaugh map corresponding to each of sub-circuits 150-1 to 150-n based on the input/output relation of each sub-circuit. By way of example, assuming that a sub-circuit having two (2) control qubits, i.e., a first control qubit and a second control qubit, outputs a value "A" when input values of the sub-circuit are "|1>," and outputs a value "B" otherwise, a sub-quantum Karnaugh map corresponding to the sub-circuit can be obtained as follows.

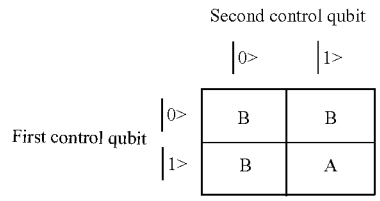

Third logic unit 140 receives as input the multiple number (n) of sub-quantum Karnaugh maps constructed by second logic unit 130 and performs a product of entries in the same position of the multiple number (n) of sub-quantum Karnaugh maps to generate a quantum Karnaugh map 160 corresponding to quantum circuit 150. Specifically, third logic unit 140 performs a product of entries in the first row and first column of each of the sub-quantum Karnaugh maps to obtain an entry for the first row and first column of quantum Karnaugh map 160. Similarly, third logic unit 140 performs a product of entries in $i^{th}$ row and $j^{th}$ column of each of sub-quantum Karnaugh maps to obtain an entry for $i^{th}$ row and $j^{th}$ column of quantum Karnaugh map 160.

Figure 2:
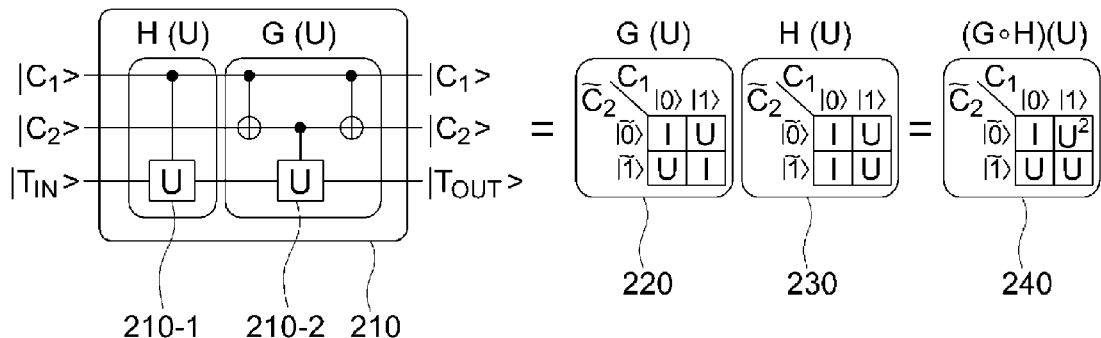
FIG. 2 shows a schematic of an illustrative embodiment of the processing of one example quantum circuit by the computing device shown in FIG. 1.

FIG. 2 shows a schematic of an illustrative embodiment of the processing of one example quantum circuit 210 by computing device 100 shown in FIG. 1. In the illustrated example, quantum circuit 210 is a three-qubit quantum circuit having two control qubits "$|C_1>$" and "$|C_2>$," and one target qubit "$|T>$." Quantum circuit 210 includes two unitary operators ("U"), and two exclusive-OR operators ("⊕"). A first unitary operator on a left 210-1 of quantum circuit 210 is turned on when $|C_1>$ is $|1>$, and a second unitary operator on a right 210-2 of quantum circuit 210 is turned on when $|C_1>$ is $|1>$ and $|C_2>$ is $|0>$, or $|C_1>$ is $|0>$ and $|C_2>$ is $|1>$. When the first unitary operator and the second unitary operator are turned off, they operate as an identity operator ("I"). Thus, it is understood that the target qubit |Tout> represents I when $|C_1>$ and $|C_2>$ is $|0>$, U when $|C_1>$ is $|0>$ and $|C_2>$ is $|1>$ or $|C_1>$ is $|1>$ and $|C_2>$ is $|1>$, and $U^2$ when $|C_1>$ is $|1>$ and $|C_2>$ is $|0>$. Here, |Tin> can be an arbitrary input value of a target qubit.

As depicted in FIG. 2, three-qubit quantum circuit 210 can be decomposed into two sub-quantum circuits G(U) and H(U) by decomposer 110 (shown in FIG. 1). In FIG. 2, H(U) is a first sub-quantum circuit that includes the first unitary operator (U), and G(U) is a second sub-quantum circuit that includes the second unitary operator (U) and two exclusive-OR operators (⊕). Although FIG. 2 illustrates three-qubit quantum circuit 210 having the first and second sub-quantum circuits H(U) and G(U), the configuration of quantum circuits is not limited to three-qubit quantum circuit 210. Moreover, the decomposition of 3-qubit quantum circuit 210 is not limited to the illustrated example. For example, 3-qubit quantum circuit 210 can be decomposed into first and second sub-quantum circuits each having one unitary operator (U), and one exclusive-OR operator (⊕).

First logic unit 120 processes possible inputs of G(U) and H(U) and determines outputs of the two sub-quantum circuits G(U) and H(U) to obtain an input/output relation of each of the sub-quantum circuits G(U) and H(U). For example, the first sub-quantum circuit H(U) executes a unitary operator U when $|C_1>$ is $|1>$. Otherwise, the first sub-quantum circuit H(U) executes an identity operator I. The second sub-quantum circuit G(U) executes a unitary operator U when one of the two inputs is |1>. Otherwise, the second sub-quantum circuit G(U) executes an identity operator I. As a result, the first and second sub-quantum circuits H(U) and G(U) have the following input/output relations.

TABLE 1

G(U)'s input/output relation

| Input | Output |
|---|---|
| Both $|C_1>$ and $|C_2>$ are $|0>$, or $|1>$ | I |
| Otherwise | U |

TABLE 2

H(U)'s input/output relation

| Input | Output |
|---|---|
| $|C_1>$ is $|1>$ | U |
| Otherwise | I |

Second logic unit 130 constructs sub-quantum Karnaugh maps 220 and 230 for the sub-quantum circuits G(U) and H(U) based on the input/output relations of G(U) and H(U) as shown in Tables 1 and 2 above. Here, the "˜" notation in $\tilde{C}_2$ denotes an extended qubit version of $C_2$. For example, $$|\tilde{0}\rangle = \begin{pmatrix} 1 & 0 \\ 0 & 1 \\ 0 & 0 \\ 0 & 0 \end{pmatrix} \equiv \begin{pmatrix} I \\ O \end{pmatrix} \text{ and}$$

$$|\tilde{1}\rangle = \begin{pmatrix} 0 & 0 \\ 0 & 0 \\ 1 & 0 \\ 0 & 1 \end{pmatrix} \equiv \begin{pmatrix} O \\ I \end{pmatrix},$$

where I and O denotes an identity matrix and a null matrix in 2-dimensional Hilbert space, respectively. By using the "˜" notation, a quantum circuit can be expressed into a simplified version of the Karnaugh map as follows:

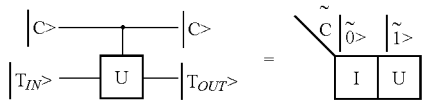

Third logic unit 140 performs an operation (G∘H)(U) between sub-quantum Karnaugh maps 220 and 230 to produce a quantum Karnaugh map 240. Here, the "∘" operation is defined such that an entry in the $i^{th}$ row and $j^{th}$ column of quantum Karnaugh map 240 of (G∘H)(U) is obtained from a product of entries $[G]_{ij}$ and $[H]_{ij}$ of the $i^{th}$ row and $j^{th}$ column of sub-quantum Karnaugh maps 230 and 220, respectively. Thus, quantum Karnaugh map 240 can be generated from the operation (G∘H)(U) between sub-quantum Karnaugh maps 220 and 230. For example, an entry in the first row and first column of quantum Karnaugh map 240 is obtained from a product of an entry "I" in the first row and first column of sub-quantum Karnaugh map 220 and an entry "I" in the first row and first column of sub-quantum Karnaugh map 230. Thus, an entry in the first row and first column of quantum Karnaugh map 240 becomes "I" (I×I=I²=I). Entries in the first row and second column, second row and first column, and second row and second column of quantum Karnaugh map 240 can be obtained in a similar manner as illustrated above.

Accordingly, quantum Karnaugh map 240 of quantum circuit 210 can be readily determined using the "∘" operation and simplified sub-quantum Karnaugh maps. Therefore, even if a quantum circuit is configured with a large number of complex circuit elements, a Karnaugh map corresponding to the quantum circuit can be efficiently obtained by decomposing the quantum circuit into simpler sub-circuits, obtaining Karnaugh maps of the sub-circuits, and performing the "∘" operation on the obtained Karnaugh maps of the sub-circuits.

Figure 3:
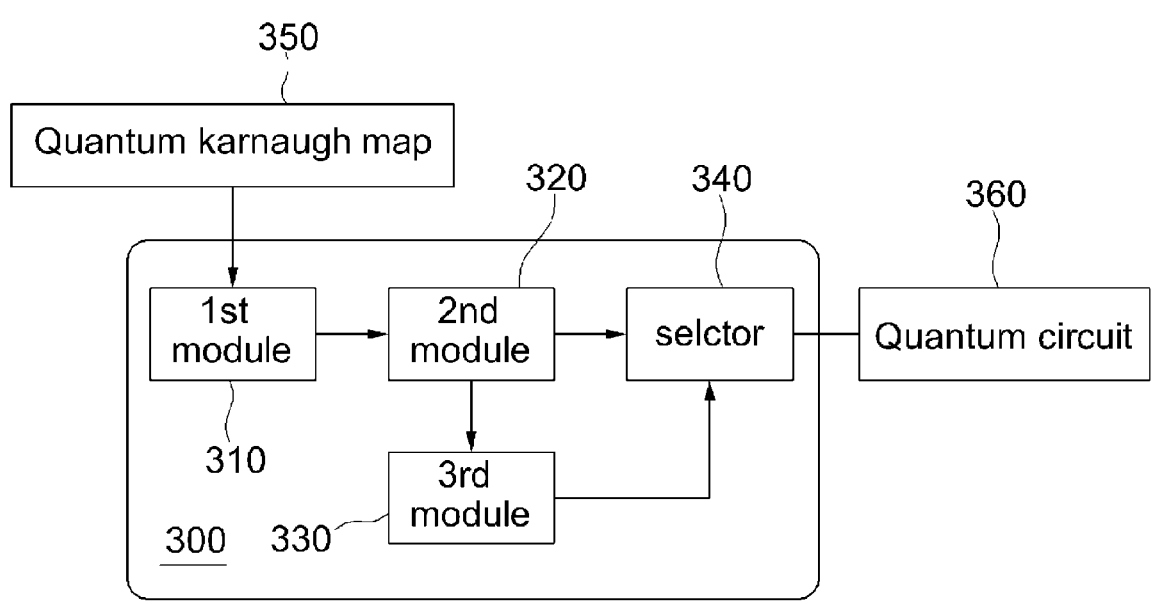
FIG. 3 shows a schematic of selected components of an illustrative embodiment of a computing device configured to design a quantum circuit based on a quantum Karnaugh map.

FIG. 3 is a schematic of selected components of an illustrative embodiment of a computing device configured to design a quantum circuit based on a quantum Karnaugh map.

With reference to FIG. 3, a computing device 300 includes a first module 310, a second module 320, a third module 330, and a selector 340. First module 310 receives a quantum Karnaugh map 350, and groups entries other than identity (I) entries in quantum Karnaugh map 350 into one or more rectangular groups such that each rectangular group is comprised of neighboring entries, and the number of the neighboring entries of each rectangular group is $2^n$ (n is an integer equal to or greater than zero). Various sets of rectangular groups for quantum Karnaugh map 350 can be determined. In addition, each sequence of control qubits of quantum Karnaugh map 350 can be used in determining the sets of rectangular groups. For example, assuming that a quantum Karnaugh map has two control qubits $C_1$ and $C_2$, various sets of rectangular groups can be obtained using control qubits $C_1$ and $C_2$ in Gray Code sequence, which is an ordering of $2^n$ binary numbers such that only one bit changes from one entry to the next. By way of example, Gray Code sequence of control qubits $C_1$ and $C_2$ can be |00>, |01>, |11>, and |10>. In addition to Gray Code sequence, other sequences, such as "|00>, |11>, |01>, and |10>", "|00>, |01>, |10>, and |11>", "|00>, |10>, |11>, and |01>", "|01>, |00>, |01>, and |10>," and |01>, |11>, |01> and |10>," can be used.

Second module 320 receives the determined multiple number of sets of rectangular groups from first module 310 and determines a multiple number of quantum circuits corresponding to quantum Karnaugh map 350 based on the sets of rectangular groups. For example, the quantum circuits can be determined by obtaining qubit gates corresponding to rectangular groups where each qubit gate is controlled by qubits which each rectangular group depends on, and decomposing each qubit gate into C-NOT gates, and single qubit gates. Details for C-NOT gate, and single qubit gate will be explained later.

Third module 330 receives the multiple number of quantum circuits determined by second module 320 and determines the number of C-NOT gates and single qubit gates required for each quantum circuit determined based on the multiple number of sets of rectangular groups. Selector 340 receives the multiple number of quantum circuits from second module 320 and the number of C-NOT gates and single qubit gates required for each quantum circuit from third module 330, and chooses a quantum circuit 360 which requires the minimum number of C-NOT gates and single qubit gates based on the numbers of C-NOT gates and single qubit gates for each quantum circuit determined in third module 330. Then, selector 340 outputs the chosen quantum circuit (for example, quantum circuit 360).

Figure 4:
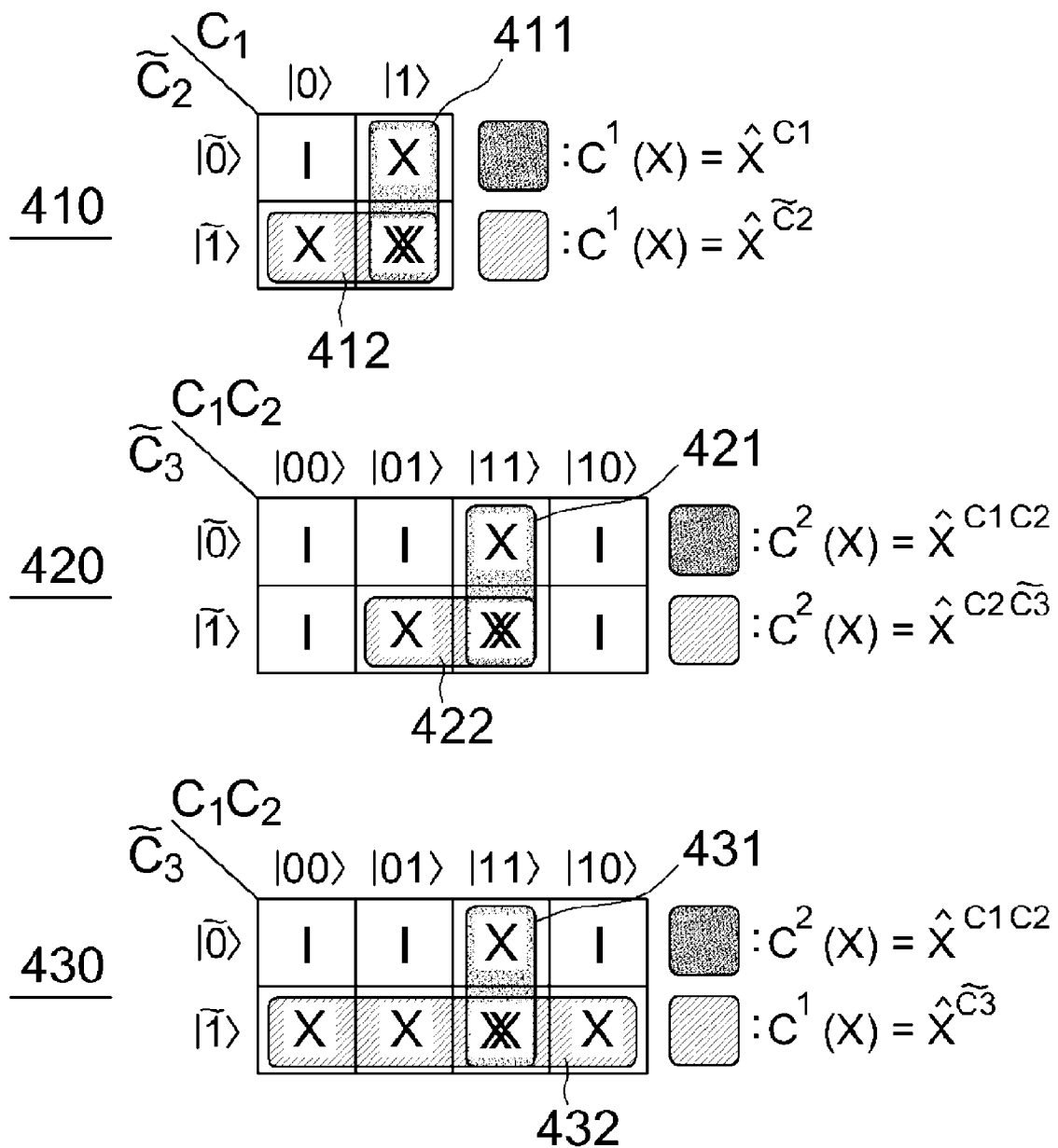
FIG. 4 shows schematics of examples of the quantum Karnaugh map shown in FIG. 3.

FIG. 4 shows schematics of examples of the quantum Karnaugh map of FIG. 3. One example is a quantum Karnaugh map 410 that corresponds to a quantum circuit controlled by two control qubits $C_1$, and $\tilde{C}_2$. Quantum Karnaugh map 410 includes two rectangular groups 411 and 412 where each rectangular group includes "X" entries other than identity (I) entries. Quantum Karnaugh map 410 shows that rectangular group 411 depends on control qubit $C_1$ regardless of control qubit $\tilde{C}_2$, and rectangular group 412 depends on control qubit $\tilde{C}_2$ regardless of control qubit $C_1$. Thus, quantum gates corresponding to rectangular groups 411 and 412 are one-qubit gates which are controlled by control qubits $C_1$ and $\tilde{C}_2$, respectively.

Another example is a quantum Karnaugh map 420 that corresponds to a quantum circuit controlled by three control qubits $C_1$, $C_2$, and $\tilde{C}_3$. Quantum Karnaugh map 420 includes two rectangular groups 421 and 422 where each rectangular group includes "X" entries other than identity (I) entries. Quantum Karnaugh map 420 shows that rectangular group 421 depends on control qubits $C_1$ and $C_2$ regardless of control qubit $\tilde{C}_3$, and rectangular group 422 depends on control qubits $C_2$ and $\tilde{C}_3$ regardless of control qubit $C_1$. Thus, quantum gates corresponding to rectangular groups 421 and 422 are two-qubit gates which are controlled by control qubits $C_1$ and $C_2$, and control qubits $C_2$ and $\tilde{C}_3$, respectively.

A further example is a quantum Karnaugh map 430 that corresponds to a quantum circuit controlled by three control qubits $C_1$, $C_2$, and $\tilde{C}_3$. Quantum Karnaugh map 430 includes two rectangular groups 431 and 432 where each rectangular group includes "X" entries other than identity (I) entries. Quantum Karnaugh map 430 shows that rectangular group 431 depends on control qubits $C_1$ and $C_2$, and rectangular group 432 depends on control qubit $\tilde{C}_3$. Thus, a quantum gate corresponding to rectangular groups 431 is two-qubit gate which is controlled by control qubits $C_1$ and $C_2$ regardless of control qubit $\tilde{C}_3$, and a quantum gate corresponding to rectangular groups 432 is one-qubit gate which is controlled by control qubit $\tilde{C}_3$ regardless of control qubits $C_1$ and $C_2$.

In this way, the type of operator "X" and the number of control qubits for each rectangular group can be determined. Thus, $C^m(X)$ having m control qubits for each rectangular group can be obtained. Here, m is an integer equal to or greater than zero.

Figure 5A:
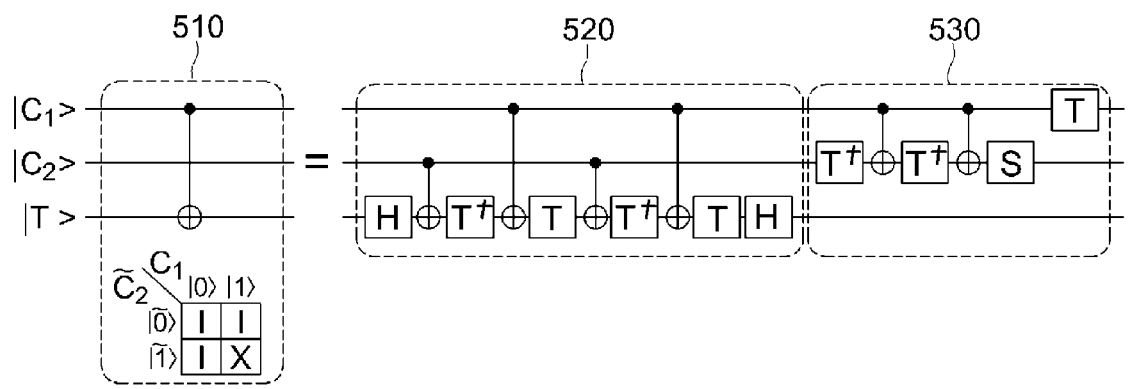
FIGS. 5(a) and 5(b) show schematics of a $C^2(X)$ gate and its decomposed structure.
Figure 5B:
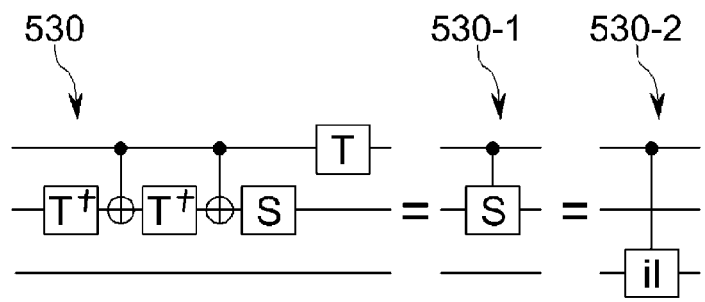

FIGS. 5(a) and 5(b) show schematics of a $C^2(X)$ gate, and its decomposed structure. With reference to FIG. 5(a) and FIG. 5(b), it will be described that each of gates obtained from rectangular groups of a quantum Karnaugh map can be decomposed into single qubit gates and C-NOT gates which are essential components in quantum computation. FIG. 5(a) represents a decomposed structure of one example of two-qubit $C^2(X)$ gate. It is known that $C^2(X)$ gate 510 in FIG. 5(a) can be simulated to an arbitrary degree of accuracy using single qubit gates H, S, T, $T^\dagger$ and C-NOT gates which are essential components in the implementation of a quantum circuit where $$H = \frac{1}{\sqrt{2}}\begin{pmatrix} 1 & 1 \\ 1 & -1 \end{pmatrix}, S = \begin{pmatrix} 1 & 0 \\ 0 & i \end{pmatrix}, T = \begin{pmatrix} 1 & 0 \\ 0 & e^{i\pi/4} \end{pmatrix}, T^\dagger = \begin{pmatrix} 1 & 0 \\ 0 & e^{-i\pi/4} \end{pmatrix},$$

and C-NOT gate represents exclusive-OR operation "⊕".

A first block 520 of the decomposed structure of $C^2(X)$ gate 510 in FIG. 5(a) includes two H gates, two T gates, two $T^\dagger$ gates, two C-NOT gates controlled by $C_1$, and two C-NOT gates controlled by $C_2$. A second block 530 of the decomposed structure of $C^2(X)$ gate 510 in FIG. 5(a) includes one T gate, two $T^\dagger$ gates, one S gate, and two C-NOT gates controlled by $C_1$. In addition, second block 530 can be expressed using $C^1(S) \otimes I$ gate 530-1, which is equivalent to "iI" gate 530-2 controlled by $C_1$ and $C_2$, as shown in FIG. 5(b). Thus, the decomposed structure of $C^2(X)$ gate 510 in FIG. 5(a) can be expressed using the "∘" operation, and thus quantum Karnaugh maps corresponding to the single qubit gates and C-NOT gates as follows.

$$C^2(X) = i\hat{I}^{C_1 C_2} \circ \hat{H} \circ \hat{T} \circ \hat{X}^{C_1} \circ \hat{T}^\dagger \circ \hat{X}^{C_2} \circ \hat{T}$$
$$\hat{X}^{C_1} \circ \hat{T}^\dagger \circ \hat{X}^{C_2} \circ \hat{H} \qquad \text{Equation (1)}$$

In Equation (1), $i\hat{I}$, $\hat{H}$, $\hat{T}$, and $\hat{T}^\dagger$ represent corresponding quantum Karnaugh maps of single qubit gates iI, H, T, and $T^\dagger$, respectively. Further, $\hat{X}$ represents a corresponding quantum Karnaugh map of C-NOT gate, and the subscripts "$C_1$" and "$C_2$" denote the case where entries in a quantum Karnaugh map $\hat{X}$ of each single qubit gate are unitary operators when control quits $|C_1\rangle$ and $|C_2\rangle$ are in the state $|1\rangle$, respectively.

Based on Equation (1), m-qubit $C^m(X)$ gate can be expressed using the "∘" operation, and thus quantum Karnaugh maps corresponding to the single qubit gates and C-NOT gates as follows.

$$C^m(X) = i\hat{I}^{C_1 \ldots C_m} \circ \hat{H} \circ \hat{T} \circ \hat{X}^{C_1 \ldots C_i} \circ \hat{T}^\dagger \circ \hat{X}^{C_{i+1} \ldots C_m} \circ \hat{T}$$
$$\hat{X}^{C_1 \ldots C_i} \circ \hat{T}^\dagger \circ \hat{X}^{C_{i+1} \ldots C_m} \circ \hat{H} \qquad \text{Equation (2)}$$

Equation (2) can be derived by replacing $i\hat{I}^{C_1 C_2}$, $\hat{X}^{C_1}$, and $\hat{X}^{C_2}$ of $C^2(X)$ in Equation (1) with $i\hat{I}^{C_1 \ldots C_m}$, $\hat{X}^{C_1 \ldots C_i}$, and $\hat{X}^{C_{i+1} \ldots C_m}$, respectively. In addition, assume that j=m−i (each of j, m, and j is equal to or greater than zero), $\hat{X}^{C_1 \ldots C_i}$ and $\hat{X}^{C_{i+1} \ldots C_m}$ can be replaced by $C^i(X)$ and $C^j(X)$, respectively. Thus, $C^m(X)$ can also be expressed as follows.

$$C^m(X) = i\hat{I}^{C_1 \ldots C_m} \circ \hat{H} \circ \hat{T} \circ C^i(X) \circ \hat{T}^\dagger \circ C^j(X) \circ \hat{T} \circ C^i$$
$$(X) \hat{T}^\dagger \circ C^j(X) \circ \hat{H} \qquad \text{Equation (3)}$$

By recursively performing a procedure for obtaining $C^m(X)$ using $C^i(X)$ and $C^j(X)$ until i and j become two (2), $C^m(X)$ can be decomposed into single qubit gates and C-NOT gates. Using Equations (1), (2), and (3) for each set of rectangular groups of quantum Karnaugh map 350, a multiple number of quantum circuits corresponding to quantum Karnaugh map 350 can be determined.

Once the multiple number of quantum circuits are determined, the number of gates that each of the quantum circuits includes can be counted at third module 330. A computer simulation shows that the minimum number $N_m$ of single qubit gates and C-NOT gates required to construct $C^m(X)$ gate can be represented by Equation (4) below.

$$N_m = \begin{cases} 10 + 4N_{m/2} + 2N_{m-1} + \sum_{l=3}^{m}(3 + 2N_{l-2}) & \text{if } R(m/2) = 0 \\ 10 + 2N_{Q(m/2)+1} + 2N_{Q(m/2)} + 2N_{m-1} + \sum_{l=3}^{m}(3 + 2N_{l-2}) & \text{if } R(m/2) = 1 \end{cases}$$

Equation (4)

In Equation (4), Q(m/2) is a quotient of m/2 and R(m/2) is a remainder of m/2. For example, the number of single qubit gates and C-NOT gates required to construct $C^2(X)$ shown in FIG. 5(a) can be determined to be sixteen (16) based on Equation (4).

Figure 6:
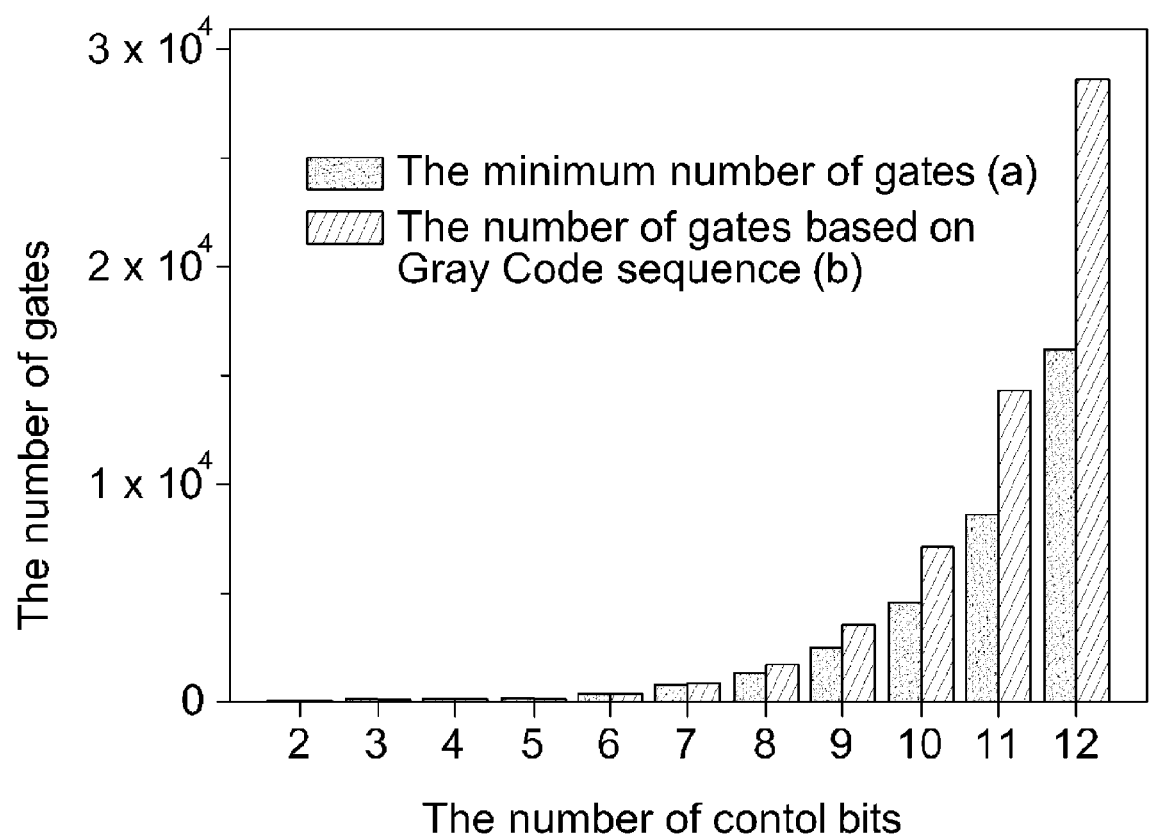
FIG. 6 shows a graph illustrating the minimum number of single qubit gates and C-NOT gates required to construct a quantum circuit for a $C^m(X)$ gate using the computing device of FIG. 3.

FIG. 6 shows a graph showing the minimum number of single qubit gates and C-NOT gates required to construct a quantum circuit for $C^m(X)$ gate using computing device 300 in FIG. 3. In FIG. 6, a bar graph (a) represents the minimum number of gates required to construct a quantum circuit using computing device 300 in FIG. 3 which is based on each qubit sequence, and a bar graph (b) represents the number of gates required to construct a quantum circuit based on Gray Code sequence. FIG. 6 shows that the number of gates of a quantum circuit designed using computing device 300 in FIG. 3 becomes significantly less than that of a quantum circuit designed using a quantum Karnaugh map based on Gray Code sequence, as the qubit number m increases.

As described above, a quantum circuit can be designed with the minimum number of single qubit gates and C-NOT gates. Thus, when a quantum Karnaugh map is given, a quantum circuit having the minimum number of gates can be determined through grouping entries of the quantum Karnaugh map, determining quantum circuits based on the grouping result, and selecting a quantum circuit with the minimum number of single qubit gates and C-NOT gates.

Figure 7:
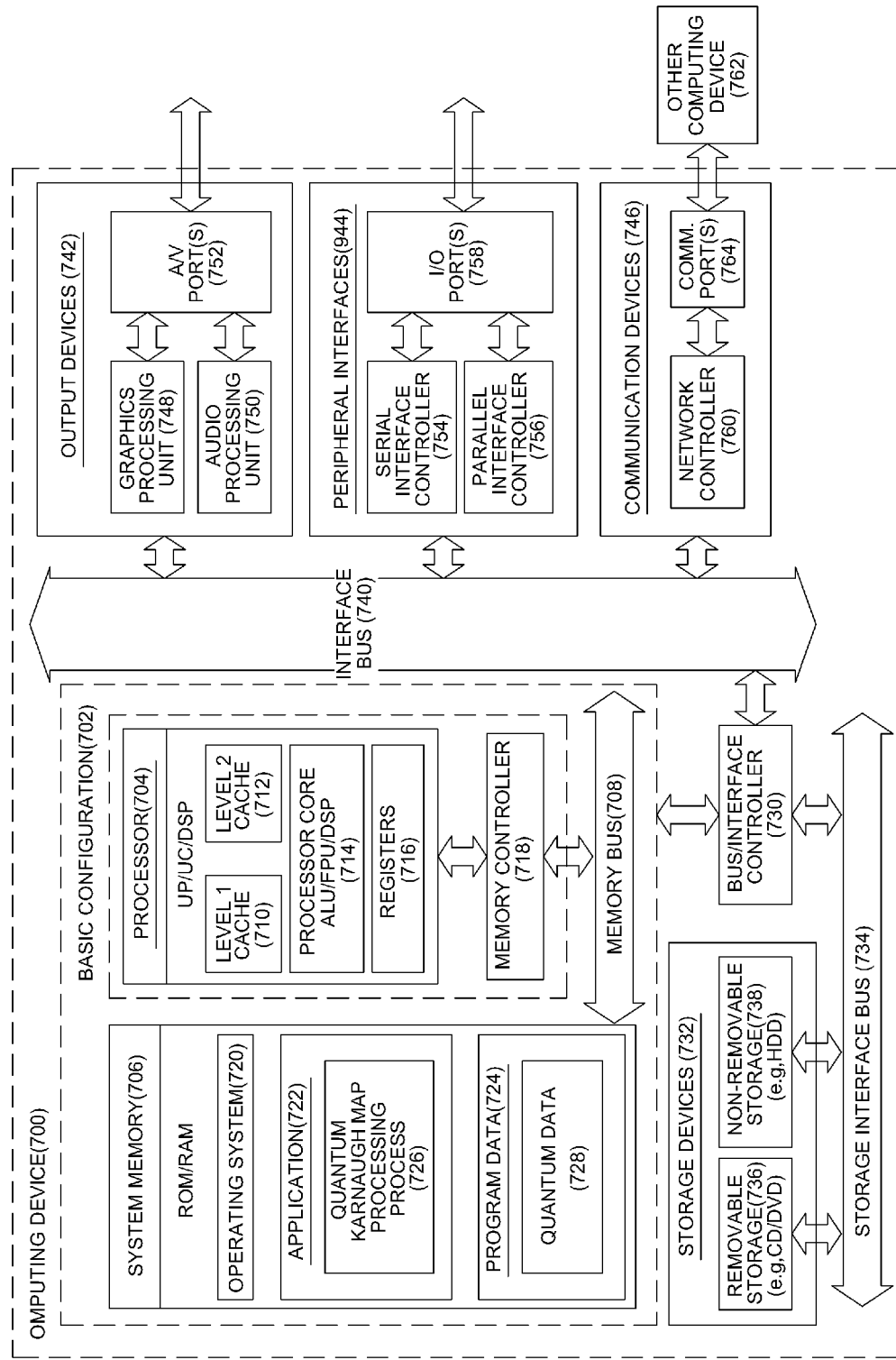
FIG. 7 is a block diagram illustrating an example computing device that is configured in accordance with the present disclosure.

FIG. 7 is a block diagram illustrating an example computing device 700 that is configured for processing a quantum Karnaugh map in accordance with the present disclosure. In a very basic configuration 702, computing device 700 typically includes one or more processors 704 and a system memory 706. A memory bus 708 may be used for communicating between processor 704 and system memory 706.

Depending on the desired configuration, processor 704 may be of any type including but not limited to a microprocessor (µP), a microcontroller (µC), a digital signal processor (DSP), or any combination thereof. Processor 704 may include one more levels of caching, such as a level one cache 710 and a level two cache 712, a processor core 714, and registers 716. An example processor core 714 may include an arithmetic logic unit (ALU), a floating point unit (FPU), a digital signal processing core (DSP Core), or any combination thereof. An example memory controller 718 may also be used with processor 704, or in some implementations memory controller 718 may be an internal part of processor 704.

Depending on the desired configuration, system memory 706 may be of any type including but not limited to volatile memory (such as RAM), non-volatile memory (such as ROM, flash memory, etc.) or any combination thereof. System memory 706 may include an operating system 720, one or more applications 722, and program data 724. Application 722 may include a quantum Karnaugh map processing process 726 (e.g., the quantum Karnaugh map generation process described above in conjunction with decomposer 110, first logic unit 120, second logic unit 130, and third logic unit 140 of FIG. 1 and/or the quantum circuit design process described above in conjunction with first module 310, second module 320, third module 330, and selector 340 of FIG. 3) that is arranged to determine a quantum Karnaugh map and/or generate a quantum circuit from a quantum Karnaugh map. Program data 724 may include quantum data 728 that may be useful for determining a quantum Karnaugh map and/or generating a quantum circuit from a quantum Karnaugh map, as is described herein. In some embodiments, application 722 may be arranged to operate with program data 724 on operating system 720 such that a Karnaugh map corresponding to the quantum circuit can be efficiently obtained and/or a quantum circuit can be efficiently designed. This described basic configuration 702 is illustrated in FIG. 7 by those components within the inner dashed line.

Computing device 700 may have additional features or functionality, and additional interfaces to facilitate communications between basic configuration 702 and any required devices and interfaces. For example, a bus/interface controller 730 may be used to facilitate communications between basic configuration 702 and one or more data storage devices 732 via a storage interface bus 734. Data storage devices 732 may be removable storage devices 736, non-removable storage devices 738, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 706, removable storage devices 736 and non-removable storage devices 738 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 700. Any such computer storage media may be part of computing device 700.

Computing device 700 may also include an interface bus 740 for facilitating communication from various interface devices (e.g., output devices 742, peripheral interfaces 744, and communication devices 746) to basic configuration 702 via bus/interface controller 730. Example output devices 742 include a graphics processing unit 748 and an audio processing unit 750, which may be configured to communicate to various external devices such as a display or speakers via one or more A/V ports 752. Example peripheral interfaces 744 include a serial interface controller 754 or a parallel interface controller 756, which may be configured to communicate with external devices such as input devices (e.g., keyboard, mouse, pen, voice input device, touch input device, etc.) or other peripheral devices (e.g., printer, scanner, etc.) via one or more I/O ports 758. An example communication device 746 includes a network controller 760, which may be arranged to facilitate communications with one or more other computing devices 762 over a network communication link via one or more communication ports 764.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 700 may also be implemented as a personal computer including both laptop computer and non-laptop computer configurations.

A storage medium device having computer readable instructions embodied therewith is provided. The computer readable instructions, when executed on computing device 700, cause computing device 700 to perform the method to determine a quantum Karnaugh map and/or to generate a quantum circuit from a quantum Karnaugh map, as is described herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A computing device configured to design a quantum circuit comprising:
a first module configured to group entries other than identity (I) entries in a quantum Karnaugh map into one or more groups, and to determine a plurality of sets of groups, wherein each group is comprised of neighboring entries, and the number of the neighboring entries of each group is $2^n$ (n is an integer equal to or greater than zero);
a second module configured to determine a plurality of quantum circuits corresponding to the quantum Karnaugh map based on the plurality of sets of groups, wherein the plurality of sets of groups are decomposed into C-NOT gates and single qubit gates;
a third module configured to determine a number of single qubit gates and C-NOT gates required for each of the plurality of quantum circuits; and a selector configured to select a quantum circuit having a minimum number of single qubit gates and C-NOT gates among the plurality of quantum circuits.

2. The computing device of claim 1, wherein the first module is further configured to determine the plurality of sets of groups for each sequence of control qubits of the quantum Karnaugh map.

3. The computing device of claim 2, wherein the minimum number of single qubit gates and C-NOT gates is determined based on the following equation:

$$N_m = \begin{cases} 10 + 4N_{m/2} + 2N_{m-1} + \sum_{l=3}^{m}(3 + 2N_{l-2}) & \text{if } R(m/2) = 0 \\ 10 + 2N_{Q(m/2)+1} + 2N_{Q(m/2)} + 2N_{m-1} + \sum_{l=3}^{m}(3 + 2N_{l-2}) & \text{if } R(m/2) = 1 \end{cases}$$

where m (m≥zero) is the number of control qubits, Q(m/2) is a quotient of m/2, R(m/2) is a remainder of m/2, and $N_m$ is the minimum number of single qubit gates and C-NOT gates.

4. The computing device of claim 1, wherein the first module is configured to group the entries other than the identity entries into one or more rectangular groups.

5. The computing device of claim 1, wherein the one or more groups include rectangular groups.

6. The computing device of claim 1, wherein the second module is configured to determine the plurality of quantum circuits by obtaining qubit gates corresponding to the groups where each qubit gate is controlled by qubits on which each group depends.

7. The computing device of claim 1, wherein the second module is configured to determine a number of control qubits for each group.

8. The computing device of claim 1, wherein the second module is configured to determine a type of operator for each group.

9. The computing device of claim 1, further comprising determining a type of operator for each rectangular group.

10. A method for designing a quantum circuit which is implemented on a computing device, the method comprising:
receiving, at the computing device, entries other than identity (I) entries in a quantum Karnaugh map to group into one or more rectangular groups, and determining a plurality of sets of the rectangular groups, wherein each rectangular group is comprised of neighboring entries, and a number of the neighboring entries of each rectangular group is $2^n$ (n is an integer equal to or greater than zero);
determining, by the computing device, a plurality of quantum circuits corresponding to the quantum Karnaugh map based on the plurality of sets of rectangular groups;
determining, by the computing device, a number of single qubit gates and C-NOT gates required for each of the plurality of quantum circuits by decomposing qubit gates corresponding to the plurality of sets of rectangular groups into single quite gates and C-NOT gates; and
selecting, by the computing device, a quantum circuit having a minimum number of single qubit gates and C-NOT gates among the plurality of quantum circuits.

11. The method of claim 10, wherein the plurality of sets of rectangular groups are determined for each sequence of control qubits of the quantum Karnaugh map.

12. The method of claim 11, wherein the minimum number of single qubit gates and C-NOT gates is determined based on the following equations:

$$N_m = \begin{cases} 10 + 4N_{m/2} + 2N_{m-1} + \sum_{l=3}^{m}(3 + 2N_{l-2}) & \text{if } R(m/2) = 0 \\ 10 + 2N_{Q(m/2)+1} + 2N_{Q(m/2)} + 2N_{m-1} + \sum_{l=3}^{m}(3 + 2N_{l-2}) & \text{if } R(m/2) = 1 \end{cases}$$

where m (m≥zero) is the number of control qubits, Q(m/2) is a quotient of m/2, R(m/2) is a remainder of m/2, and $N_m$ is the minimum number of gates.

13. A storage medium device having computer readable instructions embodied therewith, the computer readable instructions when executed on a computing device cause the computing device to perform the method of claim 10.

14. The method of claim 10, further comprising obtaining qubit gates corresponding to the rectangular groups where each qubit gate is controlled by qubits on which each rectangular group depends.

15. The method of claim 10, further comprising determining a number of control qubits for each rectangular group.

16. A computing device configured to design a quantum circuit comprising:
a first module configured to group entries other than identity (I) entries in a quantum Karnaugh map into one or more groups, and to determine a plurality of sets of groups that includes groups for each sequence of control qubits of the quantum Karnaugh map, wherein each group is comprised of neighboring entries, and the number of the neighboring entries of each group is $2^n$ (n is an integer equal to or greater than zero);
a second module configured to determine a plurality of quantum circuits corresponding to the quantum Karnaugh map based on the plurality of sets of groups;
a third module configured to determine a number of single qubit gates and C-NOT gates required for each of the plurality of quantum circuits; and
a selector configured to select a quantum circuit having a minimum number of single qubit gates and C-NOT gates among the plurality of quantum circuits.

17. The computing device of claim 16, wherein:
the first module is configured to group the entries other than the identity entries into one or more rectangular groups;
the second module is configured to determine a number of control qubits for each group and determine a type of operator for each group.

18. A method for designing a quantum circuit which is implemented on a computing device, the method comprising:
receiving, at the computing device, entries other than identity (I) entries in a quantum Karnaugh map to group into one or more rectangular groups, and determining a plurality of sets of the rectangular groups that includes groups for each sequence of control qubits of the quantum Karnaugh map, wherein each rectangular group is comprised of neighboring entries, and a number of the neighboring entries of each rectangular group is $2^n$ (n is an integer equal to or greater than zero);
determining, by the computing device, a plurality of quantum circuits corresponding to the quantum Karnaugh map based on the plurality of sets of rectangular groups;

determining, by the computing device, a number of single qubit gates and C-NOT gates required for each of the plurality of quantum circuits; and selecting, by the computing device, a quantum circuit having a minimum number of single qubit gates and C-NOT gates among the plurality of quantum circuits.

19. The method of claim 18, further comprising:
determining a number of control qubits for each group; and
determining a type of operator for each group.

20. A computing device configured to design a quantum circuit comprising:
a first module configured to group entries other than identity (I) entries in a quantum Karnaugh map into one or more groups, and to determine a plurality of sets of groups, wherein each group is comprised of neighboring entries, and the number of the neighboring entries of each group is $2^n$ (n is an integer equal to or greater than zero);
a second module configured to determine a plurality of quantum circuits corresponding to the quantum Karnaugh map based on the plurality of sets of groups, wherein the second module is configured to determine a type of operator for each group;
a third module configured to determine a number of single qubit gates and C-NOT gates required for each of the plurality of quantum circuits; and
a selector configured to select a quantum circuit having a minimum number of single qubit gates and C-NOT gates among the plurality of quantum circuits.

21. The computing device of claim 20, wherein:
the first module is configured to:
group the entries other than the identify entries into one or more rectangular groups; and
determine the plurality of sets of groups for each sequence of control qubits of the quantum Karnaugh map; and
the second module is configured to determine a number of control qubits for each group.

22. A method for designing a quantum circuit which is implemented on a computing device, the method comprising:
receiving, at the computing device, entries other than identity (I) entries in a quantum Karnaugh map to group into one or more rectangular groups, and determining a plurality of sets of the rectangular groups, wherein each rectangular group is comprised of neighboring entries, and a number of the neighboring entries of each rectangular group is $2^n$ (n is an integer equal to or greater than zero);
determining, by the computing device, a type of operator for each rectangular group;
determining, by the computing device, a plurality of quantum circuits corresponding to the quantum Karnaugh map based on the qubit gates corresponding to the plurality of sets of rectangular groups;
determining, by the computing device, a number of single qubit gates and C-NOT gates required for each of the plurality of quantum circuits; and
selecting, by the computing device, a quantum circuit having a minimum number of single qubit gates and C-NOT gates among the plurality of quantum circuits.

23. The method of claim 22, further comprising:
determining the plurality of sets of the rectangular groups for each sequence of control qubits of the quantum Karnaugh map; and
determining a type of operator for each group.

* * * * *

UNITED STATES PATENT AND TRADEMARK OFFICE
CERTIFICATE OF CORRECTION

| | | |
|---|---|---|
| PATENT NO. | : 8,671,369 B2 | Page 1 of 2 |
| APPLICATION NO. | : 12/633575 | |
| DATED | : March 11, 2014 | |
| INVENTOR(S) | : Ahn | |

It is certified that error appears in the above-identified patent and that said Letters Patent is hereby corrected as shown below:

On Title Page 2, item (56), References Cited under "OTHER PUBLICATIONS", in Column 1, Line 3, delete "Revie" and insert -- Review --, therefor.

In the Drawings

In Fig. 3, Sheet 2 of 6, for Tag "340", in Line 1, delete "selctor" and insert -- selector --, therefor.

In Fig. 6, Sheet 5 of 6, delete "contol" and insert -- control --, therefor.

In Fig. 7, Sheet 6 of 6, delete "(944)" and insert -- (744) --, therefor.

In Fig. 7, Sheet 6 of 6, delete "OMPUTING" and insert -- COMPUTING --, therefor.

In the Specification

In Column 5, Line 26, delete "the """ notation" and insert -- the "~" notation --, therefor.

In Column 5, Lines 35-39, delete " $|i\rangle = \begin{pmatrix} 0 & 0 \\ 0 & 0 \\ 1 & 0 \\ 0 & 1 \end{pmatrix} = \begin{pmatrix} O \\ I \end{pmatrix},$ " and insert -- $|\tilde{i}\rangle = \begin{pmatrix} 0 & 0 \\ 0 & 0 \\ 1 & 0 \\ 0 & 1 \end{pmatrix} \equiv \begin{pmatrix} O \\ I \end{pmatrix}$ . --, therefor.

In Column 5, Lines 42-43, delete "the """ notation," and insert -- the "~" notation, --, therefor.

In Column 7, Line 52, delete "circuit" and insert -- circuit, --, therefor.

Signed and Sealed this
Thirtieth Day of September, 2014

Michelle K. Lee
*Deputy Director of the United States Patent and Trademark Office*

CERTIFICATE OF CORRECTION (continued)
U.S. Pat. No. 8,671,369 B2

In Column 8, Lines 24-26, in Equation (2), delete "$C^m(X) = iI^{c_1 \ldots c_m} o H o T o X^{c_1 \ldots c_i} T^\dagger o X^{c_{i+1} \ldots c_m} o T o X^{c_1 \ldots c_i} T^\dagger o X^{c_{i+1} \ldots c_m} o H$" and insert -- $C^m(X) = iI^{c_i - c_m} o H o T o X^{c_i - c_m} o T^\dagger o X^{c_{i+1} - c_m} o T o X^{c_i - c_m} o T^\dagger o X^{c_{i+1} - c_m} o H$ --, therefor.

In Column 8, Lines 34-35, in Equation (3), delete "$C^m(X) = iI^{c_1 \ldots c_m} o H o T o C^i(X) T^\dagger o C^j(X) o T o C^i(X) T^\dagger o C^j(X) o H$" and insert -- $C^m(X) = iI^{c_i - c_m} o H o T o C^i(X) o T^\dagger o C^j(X) o T o C^i(X) o T^\dagger o C^j(X) o H$ --, therefor.

In the Claims

In Column 13, Line 61, in Claim 10, delete "quite gates" and insert -- qubit gates --, therefor.

In Column 15, Line 32, in Claim 21, delete "identify" and insert -- identity --, therefor.